(12) United States Patent
Kim et al.

(10) Patent No.: US 12,150,260 B2
(45) Date of Patent: Nov. 19, 2024

(54) DISPLAY DEVICE

(71) Applicant: LG ELECTRONICS INC., Seoul (KR)

(72) Inventors: Chulki Kim, Seoul (KR); Seunggyu Kang, Seoul (KR); Jaehun Lee, Seoul (KR); Byunghee Kim, Seoul (KR); Kidae Park, Daegu (KR)

(73) Assignee: LG ELECTRONICS INC., Seoul (KR)

( * ) Notice: Subject to any disclaimer, the term of this patent is extended or adjusted under 35 U.S.C. 154(b) by 134 days.

(21) Appl. No.: 18/152,667

(22) Filed: Jan. 10, 2023

(65) Prior Publication Data

US 2023/0232556 A1   Jul. 20, 2023

(30) Foreign Application Priority Data

Jan. 13, 2022   (KR) .......................... 10-2022-0005384

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ............................. G06F 1/1652; H05K 5/0217
See application file for complete search history.

(56) References Cited

U.S. PATENT DOCUMENTS

| | | | | |
|---|---|---|---|---|
| 9,058,758 B2 * | 6/2015 | Shin | ...... | G06F 1/1601 |
| 9,888,587 B2 * | 2/2018 | Zeng | ...... | H05K 5/0217 |
| 10,152,085 B2 * | 12/2018 | Sun | ...... | G06F 1/1637 |
| 10,229,618 B2 * | 3/2019 | Chen | ...... | G09F 15/0031 |
| 10,476,011 B2 * | 11/2019 | Kang | ...... | G02B 6/0016 |
| 10,772,224 B2 * | 9/2020 | Lan | ...... | G06F 1/1616 |
| 11,163,335 B1 * | 11/2021 | Tzeng | ...... | G06F 1/1652 |
| 11,798,439 B2 * | 10/2023 | Oh | ...... | G09F 9/35 |

(Continued)

FOREIGN PATENT DOCUMENTS

| | | |
|---|---|---|
| KR | 1020160145907 | 12/2016 |
| KR | 1020210056094 | 5/2021 |

(Continued)

OTHER PUBLICATIONS

PCT International Application No. PCT/KR2022/003420, International Search Report dated Sep. 30, 2022, 2 pages.

*Primary Examiner* — Sagar Shrestha
(74) *Attorney, Agent, or Firm* — LEE, HONG, DEGERMAN, KANG & WAIMEY

(57) ABSTRACT

Disclosed is a display device. The display device includes: a flexible display panel 110; a flexible plate 120 which is located in a rear side of the display panel 110, and coupled to the display panel 110; a backbone link 130 which is coupled to a rear side of the plate 120, and is joint-connected to a plurality of links 130a; a driving unit 170 which is located in one side of the backbone link 130, and has a motor 171; a driving link 150 which is coupled to the other side of the backbone link 130; and a lead screw 181 which extends long in a length direction of the backbone link 130, has one end connected to the motor 171, and has the other end connected to the driving link 150, wherein when the lead screw 181 rotates, the driving link 150 separates the other side of the backbone link 130 from the lead screw 181 while standing up.

12 Claims, 12 Drawing Sheets

(56) References Cited

U.S. PATENT DOCUMENTS

| | | | |
|---|---|---|---|
| 2014/0198465 A1* | 7/2014 | Park | G09F 9/00 |
| | | | 361/749 |
| 2015/0145837 A1* | 5/2015 | Park | H04N 21/41265 |
| | | | 345/184 |
| 2016/0127674 A1* | 5/2016 | Kim | H04N 21/42204 |
| | | | 348/739 |
| 2021/0141587 A1* | 5/2021 | Cho | G02F 1/133305 |
| 2023/0072005 A1* | 3/2023 | Oh | H05K 5/0226 |
| 2023/0186809 A1* | 6/2023 | Lee | H05K 5/0217 |
| | | | 345/156 |
| 2023/0240026 A1* | 7/2023 | Pyo | G06F 1/1601 |
| 2023/0397350 A1* | 12/2023 | Yoon | H05K 5/0217 |
| 2023/0397351 A1* | 12/2023 | Yoon | G06F 1/1652 |
| 2023/0410707 A1* | 12/2023 | Lee | H05K 5/0217 |
| 2024/0155784 A1* | 5/2024 | Pyo | H05K 5/0217 |

FOREIGN PATENT DOCUMENTS

| | | |
|---|---|---|
| KR | 102265333 | 6/2021 |
| KR | 1020210067159 | 6/2021 |
| KR | 102312518 | 10/2021 |

\* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2022-0005384, filed on Jan. 13, 2022, the contents of which are hereby incorporated by reference herein in its entirety.

BACKGROUND OF THE INVENTION

Field of the Invention

The present disclosure relates to a display device. More particularly, the present disclosure relates to a display device capable of changing the curvature of a display panel.

Description of the Related Art

As the information society develops, the demand for display devices is also increasing in various forms. In response to this, various display devices such as Liquid Crystal Display Device (LCD), Electroluminescent Display (ELD), Vacuum Fluorescent Display (VFD), and Organic Light Emitting Diode (OLED) have been researched and used in recent years.

Among them, an OLED panel can display an image by depositing an organic material layer capable of emitting light by itself on a substrate on which a transparent electrode is formed. The OLED panel may have a thin thickness as well as flexible characteristics. A lot of research has been accomplished on the structural characteristics of a display device having such an OLED panel.

SUMMARY OF THE INVENTION

The present invention has been made in view of the above problems, and provides a structure which can freely change the curvature of a display panel.

The present invention further provides a mechanism which can freely change the curvature of display.

In accordance with an aspect of the present invention, a display device includes: a flexible display panel 110; a flexible plate 120 which is located in a rear side of the display panel 110, and coupled to the display panel 110; a backbone link 130 which is coupled to a rear side of the plate 120, and is joint-connected to a plurality of links 130a; a driving unit 170 which is located in one side of the backbone link 130, and has a motor 171; a driving link 150 which is coupled to the other side of the backbone link 130; and a lead screw 181 which extends long in a length direction of the backbone link 130, has one end connected to the motor 171, and has the other end connected to the driving link 150, wherein when the lead screw 181 rotates, the driving link 150 separates the other side of the backbone link 130 from the lead screw 181 while standing up.

BRIEF DESCRIPTION OF THE DRAWINGS

The above and other objects, features and advantages of the present invention will be more apparent from the following detailed description in conjunction with the accompanying drawings, in which.

DETAILED DESCRIPTION OF THE PREFERRED EMBODIMENTS

Figure 1:
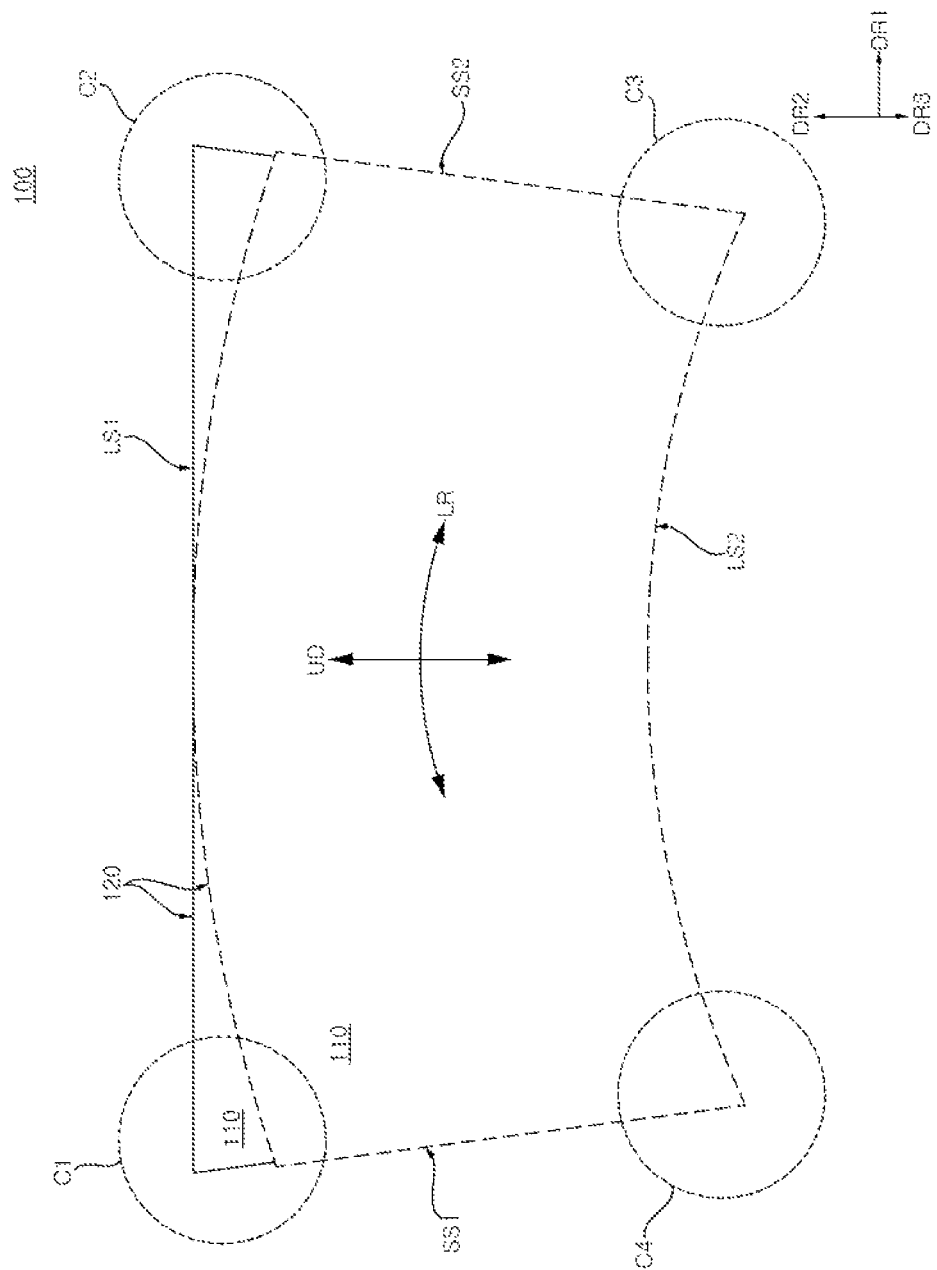
FIGS. 1 to 12 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function. In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Hereinafter, an organic light emitting diode (OLED) will be described as an example for a display panel, but the display panel applicable to the present disclosure is not limited to the OLED panel.

In addition, hereinafter, the display device may include a first long side LS1, a second long side LS2 opposite the first long side LS1, a first short side SS1 adjacent to one end of the first long side LS1 and the second long side LS2, and a second Short Side SS2 opposite to the first short side SS1.

Here, the first short side area SS1 may be referred to as a first side area, the second short side area SS2 may be referred to as a second side area opposite to the first side area, the first long side area LS1 may be referred to as a third side area which is adjacent to the first side area and the second side area, and located between the first side area and the second side area, and the second long side area LS2 may be referred to as a fourth side area which is adjacent to the first side area and the second side area, and located between the first side area and the second side area, and opposite to the third side area.

In addition, for convenience of explanation, the lengths of the first and second long sides LS1 and LS2 are illustrated and described as being longer than the lengths of the first and second short sides SS1 and SS2, but a case in which the lengths of the first and second long sides LS1 and LS2 are approximately equal to the lengths of the first and second short sides SS1 and SS2 may also be possible.

In addition, in the following, a first direction DR1 may be a direction parallel to the long side LS1, LS2 of the display device, and a second direction DR2 may be a direction parallel to the short side SS1, SS2 of the display device. A third direction DR3 may be a direction perpendicular to the first direction DR1 and/or the second direction DR2.

The first direction DR1 and the second direction DR2 may be collectively referred to as a horizontal direction. In addition, the third direction DR3 may be referred to as a vertical direction.

A side on which the display device displays an image may be referred to as a front side or a front surface. When the display device displays an image, the side from which the image cannot be observed may be referred to as a rear side or a rear surface. When the display is viewed from the front side or the front surface, the side of the first long side LS1 may be referred to as an upper side or an upper surface. Similarly, the side of the second long side LS2 may be referred to as a lower side or a lower surface. Similarly, the side of the first short side SS1 may be referred to as a left side or a left surface, and the side of the second short side SS2 may be referred to as a right side or a right surface.

Further, the first long side LS1, the second long side LS2, the first short side SS1, and the second short side SS2 may be referred to as an edge of the display device. In addition, a point where the first long side LS1, the second long side LS2, the first short side SS1, and the second short side SS2 meet each other may be referred to as a corner. For example, a point where the first long side LS1 and the first short side SS1 meet may be a first corner C1, a point where the first long side LS1 and the second short side SS2 meet may be a second corner C2, a point where the second short side SS2 and the second long side LS2 meet may be a third corner C3, and a point where the second long side LS2 and the first short side SS1 meet may be a fourth corner C4.

Here, a direction from the first short side SS1 toward the second short side SS2 or a direction from the second short side SS2 toward the first short side SS1 may be referred to as a left-right direction LR. A direction from the first long side LS1 toward the second long side LS2 or a direction from the second long side LS2 toward the first long side LS1 may be referred to as a vertical direction UD.

Referring to FIG. 1, a plate 120 may be flexible. For example, the plate 120 may be a metal plate. The plate 120 may be referred to as a flexible plate 120, a frame 120, or a module cover 120. A display panel 110 may be located in the front side or in the front surface of the plate 120. The display panel 110 may be flexible. For example, the display panel 110 may be an OLED panel.

The display panel 110 may be provided on the front surface of the display device 100 and display an image. The display panel 110 may divide an image into a plurality of pixels and output an image by matching color, brightness, and saturation for each pixel. The display panel 110 may generate light corresponding to a color of red, green, or blue according to a control signal.

The display device 100 may have a variable curvature. In the display device 100, left and right sides of the display device 100 may move to the front side. For example, in a state where an image is viewed from the front side of the display device 100, the display device 100 may be curved concavely. In this case, the plate 120 may be bent with the same curvature as the display panel 110. Alternatively, the display panel 110 may be bent to correspond to the curvature of the plate 120.

Figure 2:
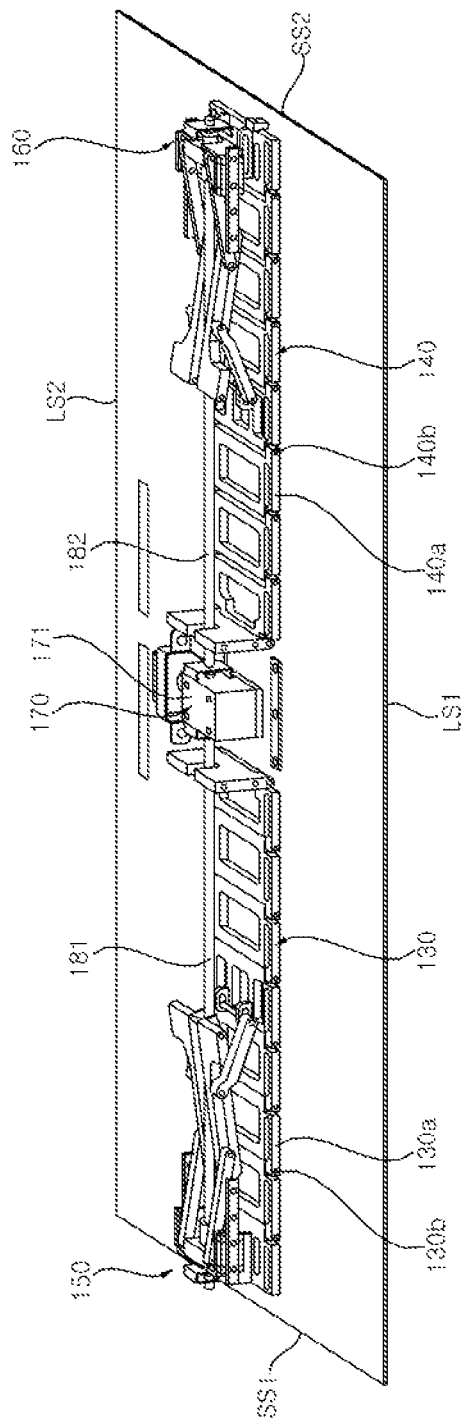
Figure 3:
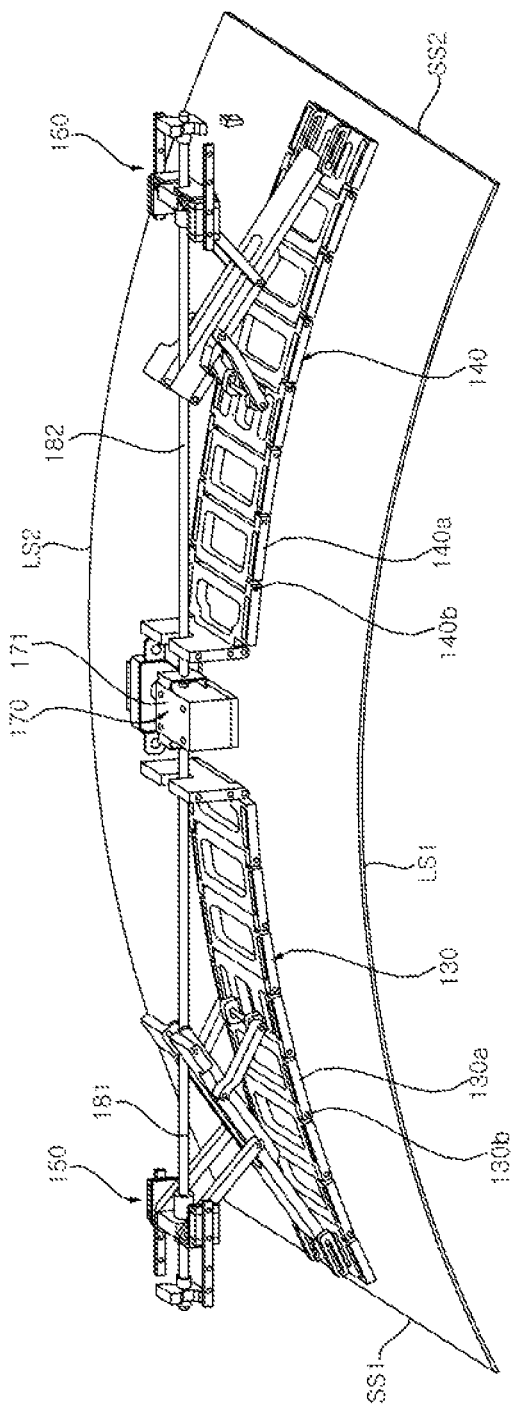

Referring to FIGS. 2 and 3, a link 130a, 140a may be coupled to the rear side of the plate 120. The link 130a, 140a may be plural. A plurality of links 130a and 140a may be connected by a joint 130b, 140b. The link 130, 140 may include a plurality of first links 130 and a plurality of second links 140. The plurality of first links 130 and the plurality of second links 140 may be coupled to the rear side of the plate 120. The first plurality of links 130 may be disposed to extend long in the left-right direction of the plate 120. The second plurality of links 140 may be disposed to extend long in the left-right direction of the plate 120. The plurality of second links 140 may be disposed in line with the plurality of first links 130. The first plurality of links 130 may be referred to as a first backbone link 130. The second plurality of links 140 may be referred to as a second backbone link 140.

The first backbone link 130 may include links 130a and joints 130b. The links 130a may be connected to each other by the joints 130b. The link 130a may pivot with respect to other link 130a about joint 130b. The second backbone link 140 may include links 140a and joints 140b. The link 140a may pivot with respect to other link 140a about joint 140b.

A driving unit 170 may be located between the first backbone link 130 and the second backbone link 140. The driving unit 170 may be fixed to the rear surface of the plate 120. The driving unit 170 may include a motor 171. A lead screw 181, 182 may be plural. The plurality of lead screws 181 and 182 may include a first lead screw 181 and a second lead screw 182. The first lead screw 181 may extend long in the length direction of the first backbone link 130. The second lead screw 182 may extend long in the length direction of the second backbone link 140. The first lead screw 181 may face the second lead screw 182 with respect to the motor 171.

The driving link 150, 160 may be plural. The plurality of driving links 150 and 160 may include a first driving link 150 and a second driving link 160. The first driving link 150 may be coupled to the first backbone link 130 adjacent to the first short side SS1 of the plate 120. The second driving link 160 may be coupled to the second backbone link 140 adjacent to the second short side SS2 of the plate 120.

One end of the first lead screw 181 may be connected to the motor 171, and the other end may be connected to the first driving link 150. One end of the second lead screw 182 may be connected to the motor 171, and the other end may be connected to the second driving link 160. The motor 171 may rotate the lead screws 181 and 182.

Hereinafter, a description of the first backbone link 130 may be applied to the second backbone link 140, and the same description will be omitted. The description of the first driving link 150 may be applied to the second driving link 160, and the same description will be omitted.

Figure 4:
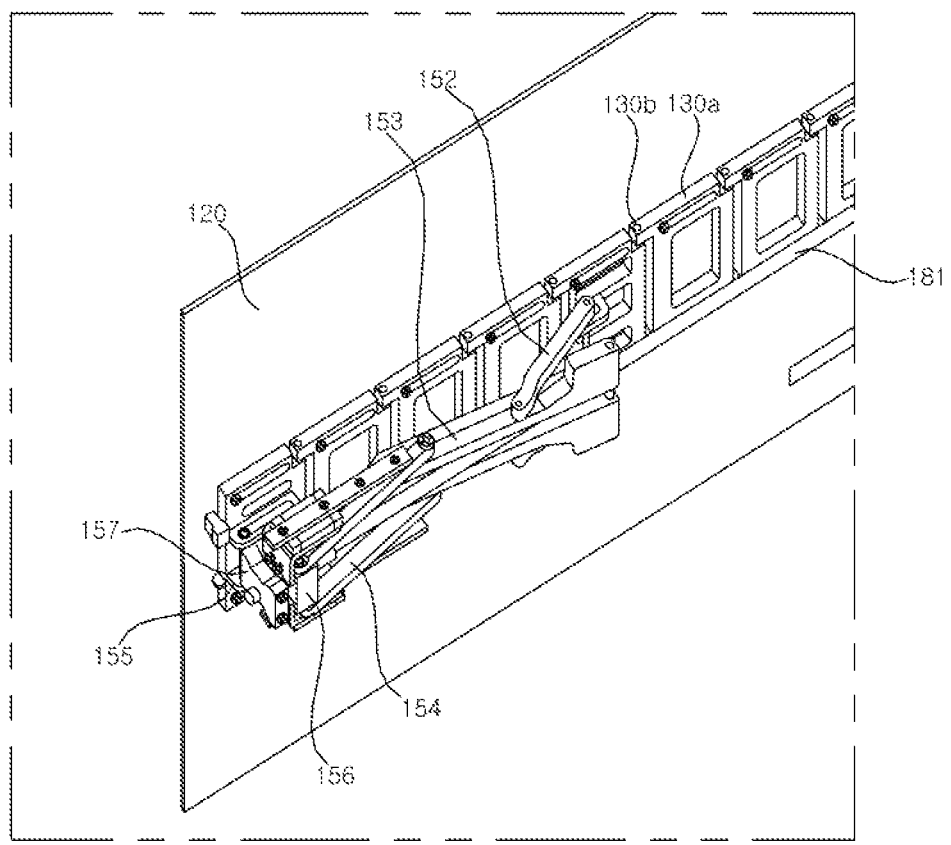
Figure 5:
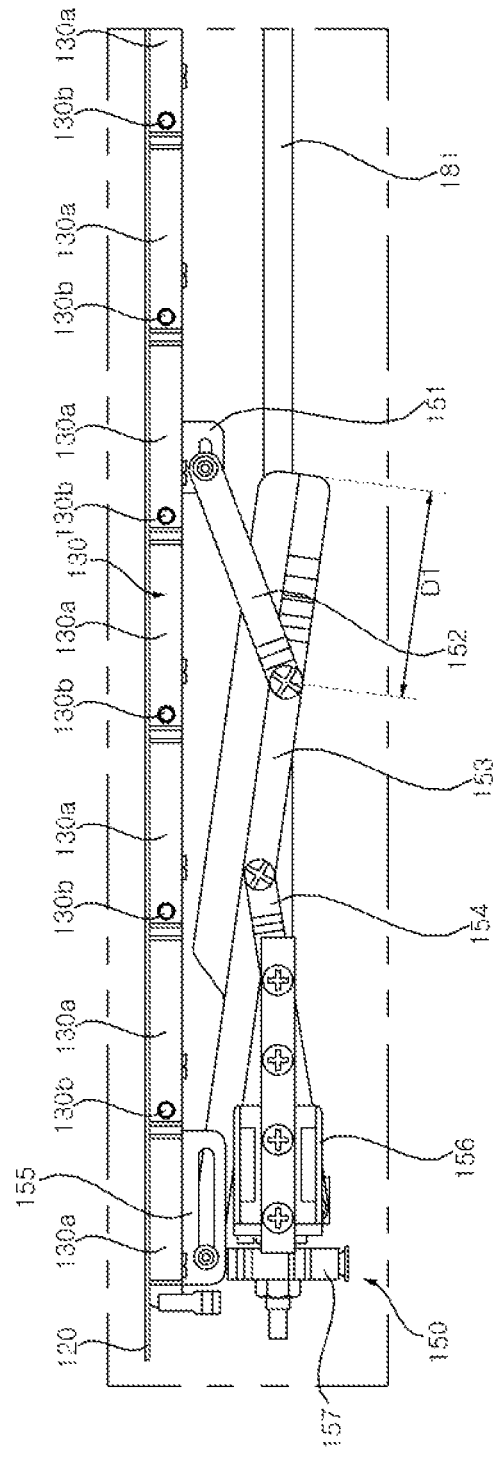

Referring to FIGS. 4 and 5, the first driving link 150 may include a first arm 152, a second arm 153, a third arm 154, and a first slider 156. The first arm 152 may be pivotally connected to the link 130a of the first backbone link 130. A first base 151 may be coupled or fixed to the link 130a of the first backbone link 130, and one end of the first arm 152 may be pivotally connected to the first base 151. The second arm 153 may be pivotally connected to the other end of the first arm 152. The first arm 152 may be pivotally connected to the second arm 153 at a position spaced apart from one end of the second arm 153 by a certain distance D1.

The other end of the second arm 153 may be pivotally connected to the link 130a of the first backbone link 130. A second base 155 may be fixed to the link 130a of the first backbone link 130. The other end of the second arm 153 may be pivotally connected to the second base 155. The third arm 154 may be pivotally connected to the second arm 153. One end of the third arm 154 may be pivotally connected to the second arm 153 at between a pivot shaft of the first arm 152 and the other end of the second arm 153. The other end of the third arm 154 may be pivotally connected to the first slider 156. The first slider 156 may move on the first lead screw 181. The first lead screw 181 may be inserted into the first slider 156 and may be screwed with the first slider 156. When the first lead screw 181 rotates, the first slider 156 may move on the first lead screw 181.

A first stopper 157 may be fixed to the first lead screw 181 adjacent to an end of the first lead screw 181.

Figure 6:
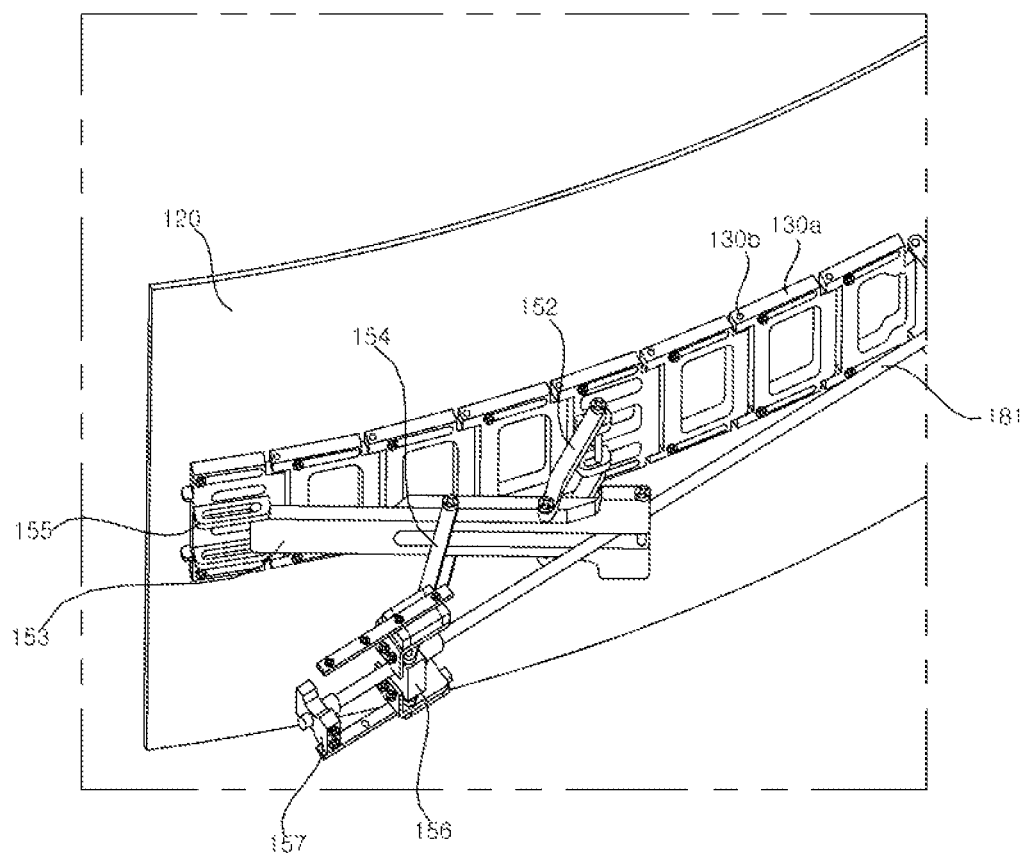
Figure 7:
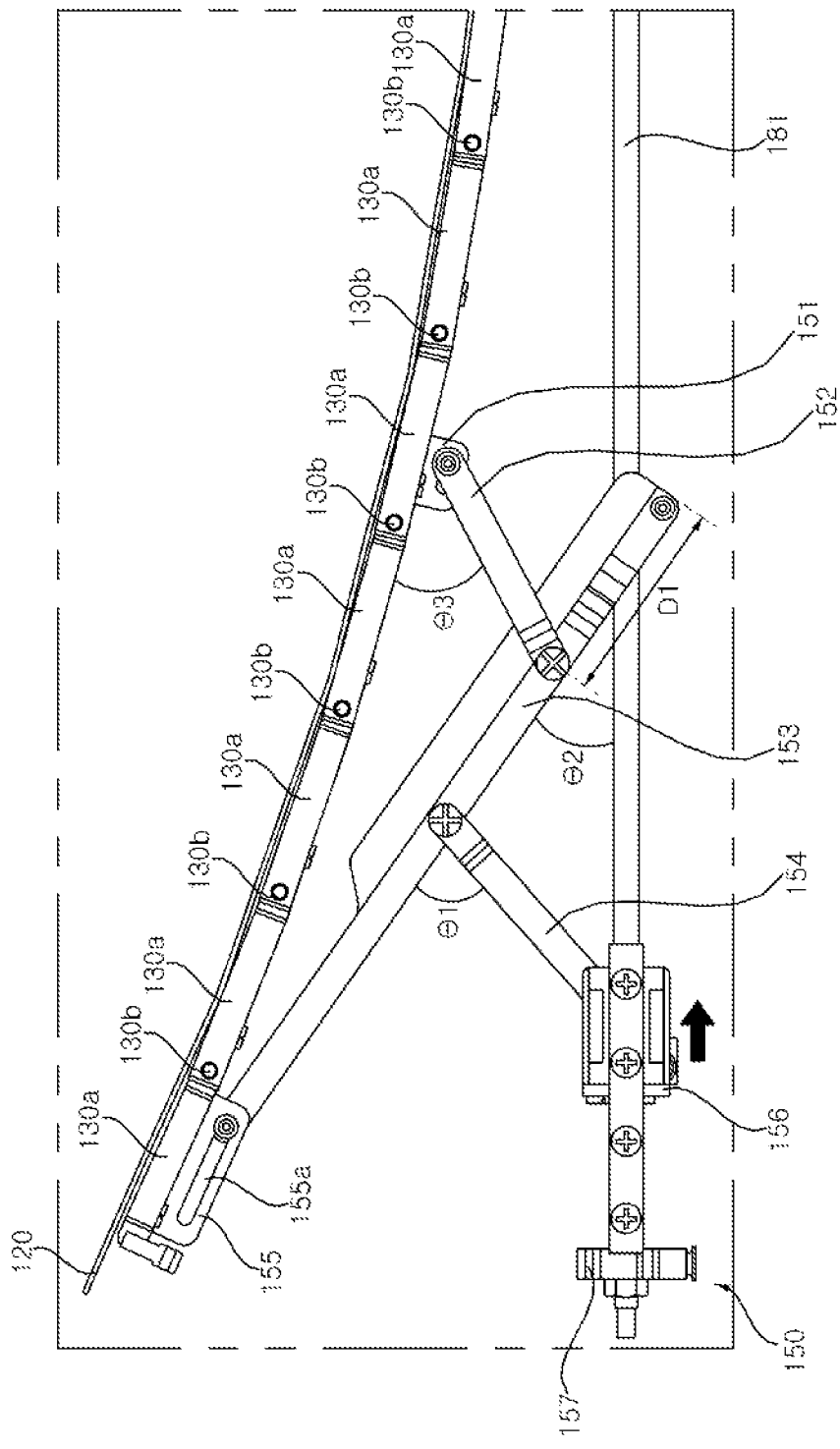

Referring to FIGS. 6 and 7, when the first lead screw 181 rotates, the first slider 145 may move on the first lead screw 181. When the first slider 145 moves, the third arm 154 may pivot with respect to the first slider 156 and the second arm 153 while increasing an angle (theta 1) with respect to the second arm 153. At the same time, the second arm 153 may pivot with respect to the second base 155 and the first arm 152 while increasing an angle (theta 2) with respect to the first lead screw 181. At this time, the second arm 153 may move while pivoting on the second base 155. The second base 155 may have a long hole 155a, and the second arm 153 may be connected to the long hole 155a. The second arm 153 may move in the long hole 155a.

When the second arm 153 pivots, the first arm 152 may pivot with respect to the first base 151 and the second arm 153. When the second arm 153 pivots, the first arm 152 may pivot with respect to the link 130a while increasing the angle with respect to the first backbone link 130.

Accordingly, the plate 120 may be curved. In this case, the plate 120 may form a positive curvature according to the movement of the first backbone link 130.

When the first lead screw 181 reversely rotates, the first slider 156 may be adjacent to the first stopper 157. The first stopper 157 may restrict the movement of the first slider 156.

Figure 8:
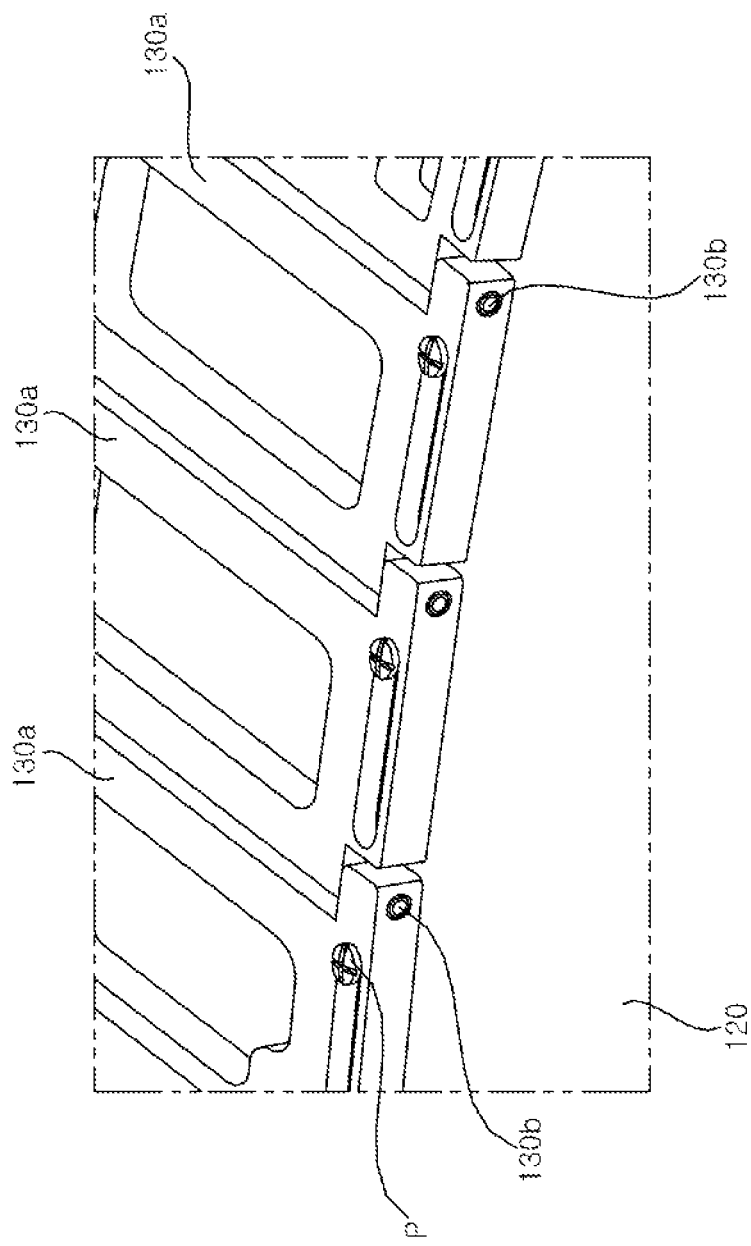
Figure 9:
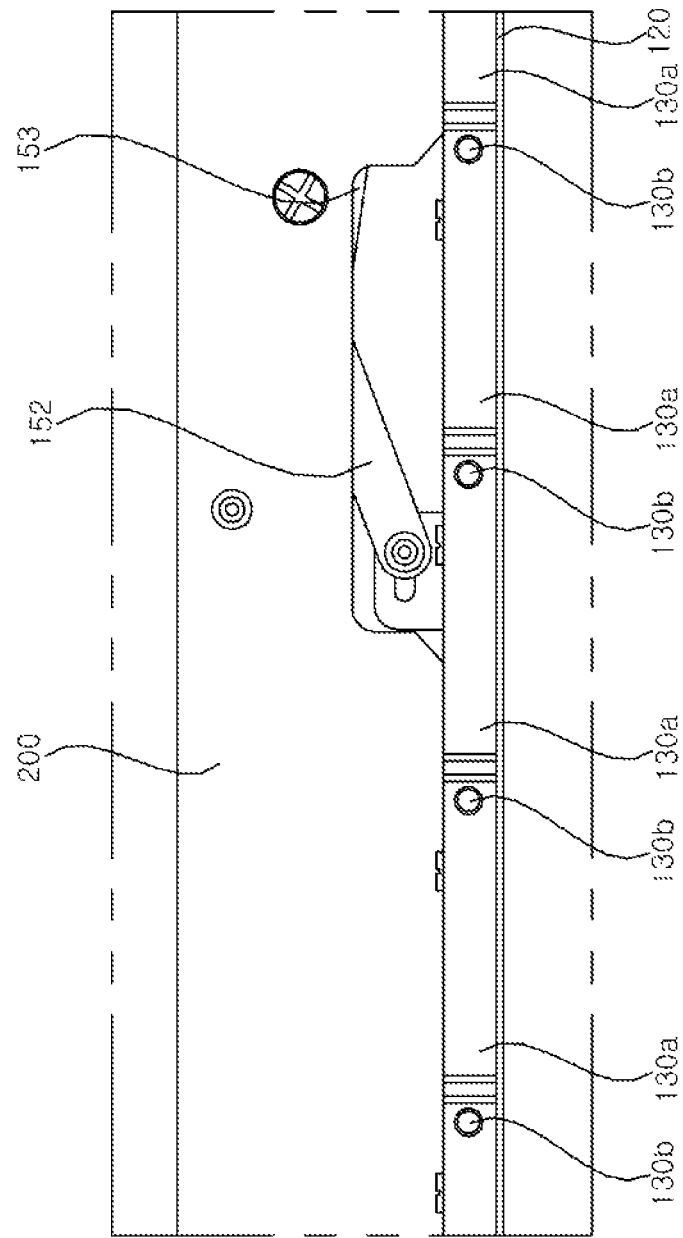
Figure 10:
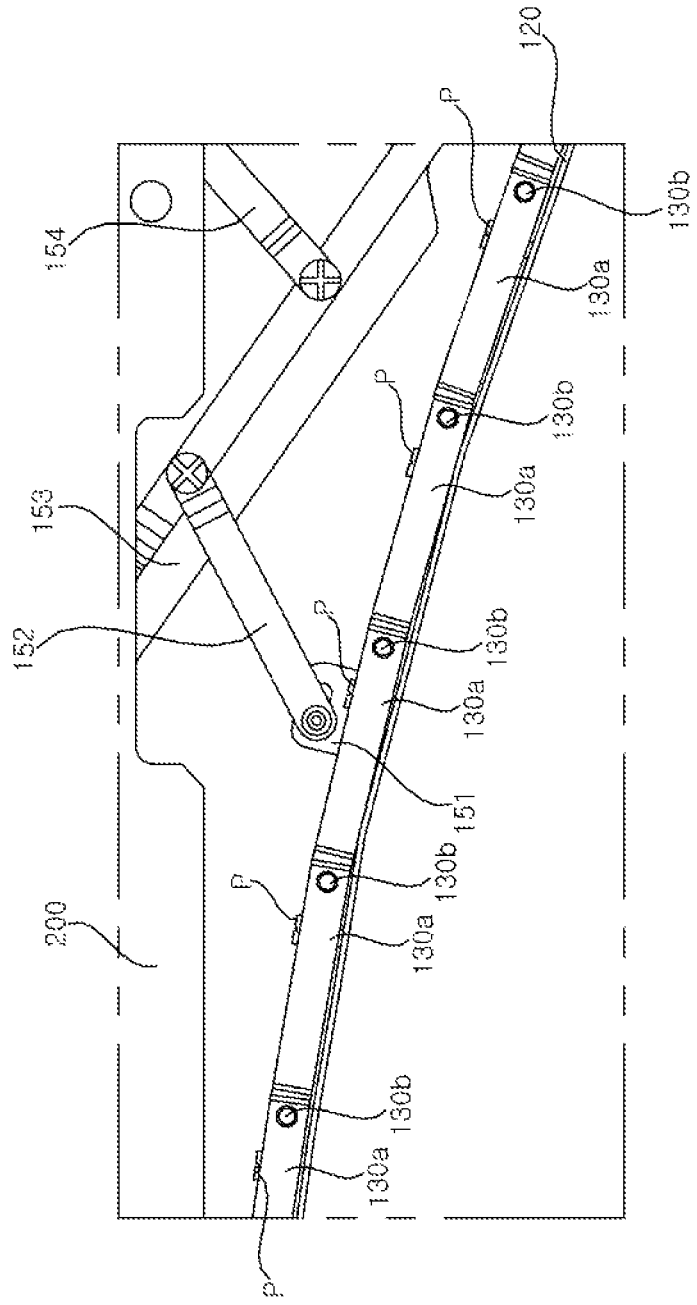
Figure 11:
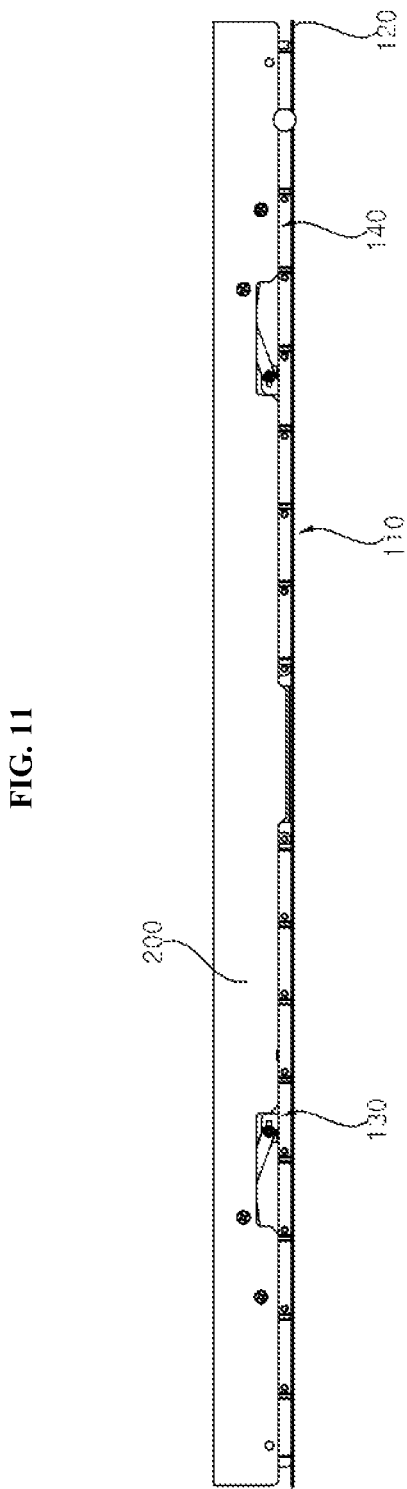
Figure 12:
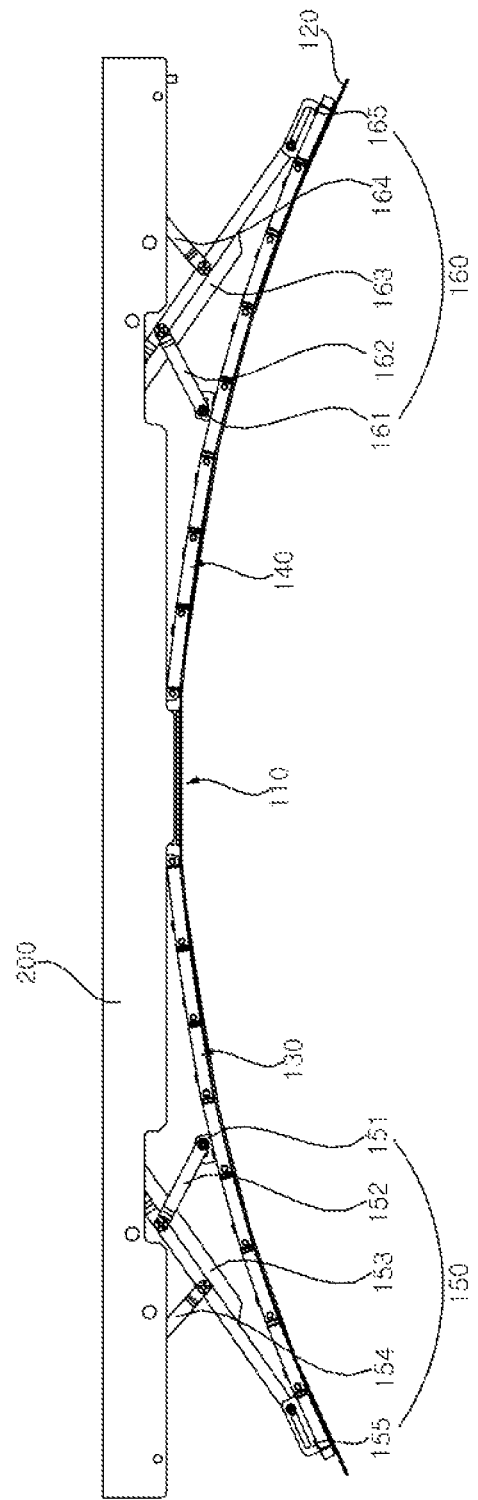

Referring to FIG. 8, the links 130a may be coupled or fixed to the rear surface of the plate 120. The link 130a may have a frame shape for weight reduction. For example, the link 130a may include metal or may be reinforced plastic. A fastening member P may be formed in or fixed to the rear surface of the plate 120. For example, the fastening member P may be a pemnut P. The link 130a may be coupled to the plate 120 by the fastening member P.

The link 130a may have a long hole LH that extends long while being adjacent to one side. The long hole LH may be formed along one side while being adjacent to one side of the link 130a. The length direction of the long hole LH may be parallel to the left-right direction of the plate 120. The long hole LH may be formed to penetrate the link 130a. The fastening member P may be inserted into the long hole LH to couple the link 130a to the plate 120.

Accordingly, in a state in which the link 130a is coupled to the plate 120, the link 130a may move on the plate 120. A gap may be formed between the link 130a and the plate 120. A clearance may be formed between the link 130a and the plate 120. That is, the fastening member P may couple the link 130a to the plate 120 while maintaining a clearance or a gap between the link 130a and the plate 120.

Referring to FIGS. 9 to 12 together with FIG. 2, a back cover 200 may have a box shape. The back cover 200 may include a flat plate portion 210 and a sidewall 220. The back cover 200 may be located in the rear side of the plate 120, and cover the driving unit 170, a driving link 150, 160, the backbone link 130, 140, and the lead screw 181, 182. In a state in which the plate 120 is flat, the links 130a and 140a of the backbone link 130, 140 may be disposed parallel to the extending direction of the flat plate portion 210 of the back cover 200. The links 130a and 140a may be aligned on the plate 120 to support the plate 120. The links 130a and 140a may contact the plate 120.

In a state in which the plate 120 is curved, the links 130a and 140a of the backbone link 130, 140 may move away from the back cover 200 as they progress toward the short side of the plate 120. The driving link 150 and 160 may push the backbone link 130, 140 while standing up from the back cover 200, and the plate 120 may form a constant curvature. When the plate 120 is curved to form a constant curvature, a clearance or a gap between the plate 120 and the links 130a and 140a may increase. The links 130a and 140a may support the plate 120. The links 130a and 140a may be partially in contact with the plate 120 and may be partially separated.

Referring to FIGS. 1 to 12, the display device includes: a flexible display panel 110; a flexible plate 120 which is located in a rear side of the display panel 110, and coupled to the display panel 110; a backbone link 130 which is coupled to a rear side of the plate 120, and is joint-connected to a plurality of links 130a; a driving unit 170 which is located in one side of the backbone link 130, and has a motor 171; a driving link 150 which is coupled to the other side of the backbone link 130; and a lead screw 181 which extends long in a length direction of the backbone link 130, has one end connected to the motor 171, and has the other end connected to the driving link 150, wherein when the lead screw 181 rotates, the driving link 150 separates the other side of the backbone link 130 from the lead screw 181 while standing up.

The driving link 150 includes: a first arm 152 having one side pivotally connected to between one side and the other side of the backbone link 130; a second arm 153 that has one side coupled to the other side of the backbone link 130, and has the other side to which the first arm 152 is pivotally connected; and a third arm 154 that has one side moved by the lead screw 181, and has the other side pivotally connected to between one side and the other side of the second arm 153.

The display device further includes a slider 156 into which the lead screw 181 is inserted, and which moves on the lead screw 181 by rotation of the lead screw 181, wherein the one side of the third arm 154 is fixed to the slider 156.

The display device further includes a first base 151 which is located between the first arm 152 and the backbone link 130, and fixed to the backbone link 130; and a second base 155 which is fixed to the other side of the backbone link 130, and located between the second arm 153 and the backbone link 130, wherein the first arm 152 is slidably connected to the first base 151, and the second arm 153 is slidably connected to the second base 155.

The first base 151 includes a first long hole to which the first arm 152 is slidably connected, and the second base 155 includes and a second long hole 155a to which the second arm 153 is slidably connected, wherein a length of the second long hole 155a is longer than a length of the first long hole.

The display device further includes a stopper 157 which is adjacent to a distal end of the lead screw 181 and fixed to the lead screw 181, wherein the stopper 157 restricts movement of the slider 156.

When the backbone link 130 curves the plate 120, a first angle (theta 1) formed by the third arm 154 and the second arm 153 is greater than a second angle (theta 2) formed by the lead screw 181 and the second arm 153.

When the backbone link 130 curves the plate 120, a third angle (theta 3) formed by the backbone link 130 and the first arm 152 is smaller than the first angle (theta 1) formed by the third arm 154 and the second arm 153.

The backbone link 130 includes: a plurality of segments 130a which are joint-connected to each other; and a long hole LH which is formed in at least one of the plurality of segments 130a, and extends long in a length direction of the backbone link 130, and further includes a fastening member P that protrudes from a rear surface of the plate 120, is fixed to a rear surface of the plate 120, and is inserted into the long hole LH.

The fastening member P is formed of a pemnut P, and the pemnut P is movable in the long hole LH.

When the driving link 150 stands up and the plate 120 is curved, the plate 120 forms a clearance from the backbone link 130.

The display device further includes a back cover 200 which is located at a rear side of the plate 120, and covers the driving unit 170, the backbone link 130, and the driving link 150, and the lead screw 181.

According to at least one embodiment of the present disclosure, it is possible to provide a structure which can freely change the curvature of a display panel.

According to at least one embodiment of the present disclosure, it is possible to provide a mechanism which can freely change the curvature of display.

Any or other embodiments of the present disclosure described above are not mutually exclusive or distinct. Any or other embodiments of the present disclosure described above may be used jointly or combined in each configuration or function.

For example, it means that configuration A described in a specific embodiment and/or drawings may be combined with configuration B described in other embodiments and/or drawings. That is, even if the coupling between the components is not directly described, it means that the coupling is possible except for the case where it is described that the coupling is impossible.

The above detailed description should not be construed as restrictive in all respects and should be considered as illustrative. The scope of the present disclosure should be determined by a reasonable interpretation of the appended claims, and all modifications within the equivalent scope of the present disclosure are included in the scope of the present disclosure.

What is claimed is:

1. A display device comprising:
   a flexible display panel;
   a flexible plate at a rear of the flexible display panel, wherein the flexible plate is mechanically coupled to the flexible display panel;
   a backbone link coupled to a rear side of the flexible plate and including a plurality of segments;
   a driver at a first side of the backbone link, the driver including a motor;
   a driving link coupled to a second side of the backbone link; and
   a lead screw extending along a length direction of the backbone link, the lead screw having a first end of the lead screw connected to the motor and a second end connected to the driving link,
   wherein the driving link is configured to move the second side of the backbone link according to a rotation of the lead screw.

2. The display device of claim 1, wherein the driving link comprises:
   a first arm having a first side pivotally connected to the backbone link between the first side and the second side of the backbone link, and a second side;
   a second arm having a first side coupled to the second side of the backbone link and a second side to which the second side of the first arm is pivotally connected; and
   a third arm having a first side movable by the lead screw and a second side pivotally connected to the second arm between the first side and the second side of the second arm.

3. The display device of claim 2, further comprising a slider into which the lead screw is inserted, the slider configured to move along the lead screw according to the rotation of the lead screw,
   wherein the first side of the third arm is connected to the slider.

4. The display device of claim 3, further comprising:
   a first base between the first arm and the backbone link, wherein the first base is fixed to the backbone link; and
   a second base between the second arm and the backbone link, wherein the second base is fixed to the second side of the backbone link,
   wherein the first arm is slidably connected to the first base, and
   wherein the second arm is slidably connected to the second base.

5. The display device of claim 4, wherein the first base has a first long hole to which the first arm is slidably connected, and
   wherein the second base has a second long hole to which the second arm is slidably connected,
   wherein the second long hole is longer than the first long hole.

6. The display device of claim 3, further comprising a stopper which is adjacent to the second end of the lead screw and fixed to the lead screw,
   wherein the stopper is configured to limit movement of the slider.

7. The display device of claim 2, wherein, based on the flexible plate being curved via the backbone link, a first angle formed by the third arm and the second arm is greater than a second angle formed by the lead screw and the second arm.

8. The display device of claim 2, wherein, based on the flexible plate being curved via the backbone link, a second angle formed by the backbone link and the first arm is smaller than a first angle formed by the third arm and the second arm.

9. The display device of claim 1, further comprising:
   a fastening member that protrudes from a rear surface of the flexible plate,
   wherein the plurality of segments are jointly connected to each other,
   wherein at least one of the plurality of segments has a long hole which extends along the length direction of the backbone link, and
   wherein the fastening member is inserted into the long hole.

10. The display device of claim 9, wherein the fastening member comprises a self-clenching nut and is movable in the long hole.

11. The display device of claim 10, wherein, based on the driving link standing up and the flexible plate being curved, the flexible plate forms a clearance with respect to the backbone link.

12. The display device of claim 1, further comprising a back cover located at the rear side of the flexible plate, and configured to cover the driver, the backbone link, the driving link, and the lead screw.

* * * * *